(12) United States Patent
Yu et al.

(10) Patent No.: US 8,233,859 B2
(45) Date of Patent: Jul. 31, 2012

(54) APPARATUS AND METHOD FOR ACCURATE AND EFFICIENT TRANSMIT POWER CONTROL

(75) Inventors: Huili Yu, Mission Viejo, CA (US); Horace Ng, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 305 days.

(21) Appl. No.: 12/609,774

(22) Filed: Oct. 30, 2009

(65) Prior Publication Data

US 2011/0105061 A1    May 5, 2011

(51) Int. Cl.
*H04B 17/00* (2006.01)

(52) U.S. Cl. ............... 455/127.2; 455/151.1; 455/151.3; 455/151.4

(58) Field of Classification Search .... 455/151.1–151.4, 455/127.2
See application file for complete search history.

(56) References Cited

U.S. PATENT DOCUMENTS

| | | | |
|---|---|---|---|
| 6,269,251 B1 * | 7/2001 | Kim | 455/522 |
| 6,760,320 B1 * | 7/2004 | Bune | 370/342 |
| 2008/0139145 A1 * | 6/2008 | Behzad | 455/127.1 |

* cited by examiner

*Primary Examiner* — Edward Urban
*Assistant Examiner* — Stacey Sorawat
(74) *Attorney, Agent, or Firm* — Garlick & Markison (57) ABSTRACT

A technique to provide accurate and efficient transmit power control by providing offset values to modify a base input gain value for a gain control circuit used to set a transmit power gain in a mobile phone. The modified gain value compensates for a ripple offset and power level offset caused by a difference in operating temperature and operating frequency from values obtained during calibration at a calibration frequency and temperature.

20 Claims, 8 Drawing Sheets

| High/Low Gain Calibration points | Expected output power at antenna | Theoretical SAW input expected TX power dBm | Expected DAC value |
|---|---|---|---|
| HighGain_3 | 23 | 0.8 | 710 |
| HighGain_2 | 18 | -4.2 | 680 |
| HighGain_1 | 2 | -20.2 | 584 |
| | | | |
| LowGain_5 | 8 | -3.2 | 680 |
| LowGain_4 | 0 | -11.2 | 640 |
| LowGain_3 | -16 | -27.2 | 560 |
| LowGain_2 | -48 | -59.2 | 400 |
| LowGain_1 | -56 | -67.2 | 360 |

| Channel number | DAC offset value | Channel number | DAC offset value |
|---|---|---|---|
| 9582 | 9.18 | 9752 | 0 |
| 9592 | 10.68 | 9762 | -1.62 |
| 9602 | 12.18 | 9772 | -1.74 |
| 9612 | 13.68 | 9782 | -0.3 |
| 9622 | 15.18 | 9792 | 3.06 |
| 9632 | 16.5 | 9802 | 7.68 |
| 9642 | 17.28 | 9812 | 12.3 |
| 9652 | 17.82 | 9822 | 16.08 |
| 9662 | 18.18 | 9832 | 19.26 |
| 9672 | 18 | 9842 | 22.2 |
| 9682 | 17.76 | 9852 | 24.42 |
| 9692 | 16.92 | 9862 | 26.04 |
| 9702 | 14.94 | 9872 | 26.76 |
| 9712 | 12.48 | 9882 | 26.64 |
| 9722 | 9.06 | 9892 | 26.52 |
| 9732 | 5.7 | 9902 | 26.4 |
| 9742 | 2.52 | 9912 | 26.28 |

APPARATUS AND METHOD FOR ACCURATE AND EFFICIENT TRANSMIT POWER CONTROL

BACKGROUND OF THE INVENTION

1. Technical Field of the Invention

The present invention relates generally to radio frequency (RF) transmitters and, more particularly, to providing accurate and efficient control over power being transmitted from a third generation 3G mobile phone.

2. Description of Related Art

Communication systems are known to support wireless and wire lined communications between wireless and/or wire lined communication devices. Such communication systems include national and/or international cellular telephone systems, the Internet, and point-to-point in-home wireless networks. Each type of communication system is constructed, and hence operates, in accordance with one or more communication standards or protocols. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), Enhanced Data rates for GSM Evolution (EDGE), General Packet Radio Service (GPRS), and extensions and/or variations thereof.

Mobile communication has changed the way people communicate and mobile phones have been transformed from a luxury item to an essential part of every day life. The use of mobile phones today is generally dictated by social situations, rather than being hampered by location or technology. While voice connections fulfill the basic need to communicate, today's mobile phones now incorporate technology to perform high speed data transfer, in order to access the Internet, download application programs ("apps"), games, audio, video, including movies and television programs. Third generation (3G) cellular networks have been specifically designed to fulfill much of these future demands for mobile phones. In this regard, universal mobile telecommunications system (UMTS) using wideband CDMA (WCDMA) has been developed as the 3G successor to GSM, GPRS and EDGE.

In operating a 3G mobile phone, the phone's transmit power is controlled by a 3G network to form a close-loop controlling scheme to utilize the capacity of spread spectrum and to ensure similar quality of communication connections to multiple users in the same cell network. Power control is extremely important in a WCDMA/UMTS system, posing multiple technical challenges for both base station (BS) and mobile phone or mobile station (MS) designs. The goal of transmit power control in a 3G network is to fully utilize the capacity of spread spectrum to allow the BS receiving the transmitted power from all MSs in the same cell sharing the same channel to have approximately equal quality of service.

Transmit power control for a 3G mobile phone entails open loop power control, outer loop power control and inner loop power control. The open loop power control is executed between a radio network controller (RNC) affiliated with a base station (BS) and a mobile phone, which is also referred to as a mobile station (MS). The open loop power control simply establishes a rough initial power setting for the MS.

The outer loop power control, which may also be referred to as slow close-loop power control, is executed between the RNC and MS at an approximate rate of 10-100 Hz. The RNC looks for a target block error rate (BLER) or a bit error rate (BER) that is specified for comparison with the estimated BLER or BER from the MS. The RNC then determines a target SIR (Signal Interference Ratio) for the inner loop power control based on the estimated BLER or BER.

The inner loop power control (ILPC), which may also be referred to as fast close-loop power control, is executed between the BS and the MS at an approximate rate of 1500 Hz to meet the target SIR determined by the BLER or BER target set by the outer loop power control. If the received SIR is lower than the target SIR threshold, the BS will issue a transmit power control (TPC) command to the MS to increase the transmit power. Alternatively, if the received SIR is higher than the target SIR threshold, the BS will issue a TPC command to the MS to decrease transmit power. If the received SIR is within a target SIR threshold range, the BS will issue a TPC command to the MS to maintain the same transmit power.

For the ILPC executed between the BS and the MS, two major technical difficulties have to be overcome to achieve accurate and efficient transmit power control for mobile phones. First, the ILPC requires a WCDMA/UMTS phone to be able to set up a transmit power level, at an accuracy of ±0.5 dB, controlled by a TPC command in an upcoming WCDMA/UMTS time slot of 0.67 mS (or at a 1500 Hz/s). The required ILPC accuracy and related speed are difficult to meet for the following reasons. Transmit power level in a mobile phone is usually a function of multiple variables, such as channel frequency ripple, temperature and nonlinearity. In providing factory calibration, the transmit power calibration performed at room temperature cannot cover all possible variations introduced during phone operation. It is very difficult to set an accurate digital-to-analog (DAC) value at once in the transmitter for a precise transmit power level and to adjust the DAC value within the allotted time period, based on transmit power level feedback, to achieve the final required transmit power level in response to the issued TPC command. Moreover, if a predetermined offset adjustment is used to compensate for a ripple based on the channel frequency, temperature variation and nonlinearity in the transmit chain, the offset adjustment is only accurate as the calibration scheme that is used to obtain the offset values. Due to the complicated relationship between the transmit power level and the variables encountered in the transmit path, it is difficult to obtain accurate offset values for the required transmit power level.

The second major technical difficulty is due to the medium of transmission, which may also be referred to as the radiated transmission. Since a MS communicates with the BS through an air interface, the MS experiences more power control fluctuation, and accuracy and reliability may be diminished for the following reasons. The fading variations caused by the phone's mobility and multipath air interface create transmit power control spikes and fluctuations. Due to antenna diversity, variations caused by multipath diversity, receiver diversity and transmit antenna diversity also directly affect the transmit power level. The delays in the power control loop, both air-interface delay and phone's circuitry delay, as well as inaccurate SIR estimates, may also increase the inaccuracy and unreliability of the transmit power. Moreover, the transmit power spikes and fluctuations created from the above factors may directly introduce interference to other users in the same cell network, and make the BS power control fluctuate even more.

To address some of these noted problems, many 3G power control efforts are focused on operations at the BS, such as BS based algorithm implementations. However, the efforts on mobile phone designs are mainly focused on building fast response close-loop transmit power control, which may or may not achieve the ILPC requirements, partly due to the technical complications and difficulties noted above.

Therefore, a need exists to provide a transmit power compensation scheme at the phone end of the communication link to accurately and efficiently generate transmit power in response to a TPC command issued by the BS.

SUMMARY OF THE INVENTION

The present invention is directed to apparatus and methods of operation that are further described in the following Brief Description of the Drawings, the Detailed Description of the Invention, and the Claims. Other features and advantages of the present invention will become apparent from the following detailed description of the embodiments of the invention made with reference to the accompanying drawings.

DETAILED DESCRIPTION OF THE INVENTION

The embodiments of the present invention may be practiced in a variety of settings that utilize a wireless device, in which the wireless device utilizes transmit power control. The described embodiments below pertain to a mobile station (MS), such as a mobile phone, that operates with a base station, in which the base station issues commands to control the transmit power from the MS. However, the invention need not be limited to this use only and the invention may be implemented in other wireless devices for similar or different use. Furthermore, although the MS is discussed in reference to a wireless network that operates within a WCDMA/UMTS system, the invention is not limited to such use. Other systems, standards and protocols may implement wireless devices that implement the present invention. The embodiments described below are for exemplary purpose and other embodiments may be readily implemented to practice the invention. It is to be noted that various circuits, components, structures and power compensation schemes are presented as examples and others may be readily implemented to practice the present invention. Furthermore, the embodiments described below use a DAC as a gain control circuit to control a gain of a variable gain amplifier, however, other gain control circuits may be implemented instead of the DAC and other gain setting circuits may be implemented instead of the variable gain amplifier.

Figure 1:
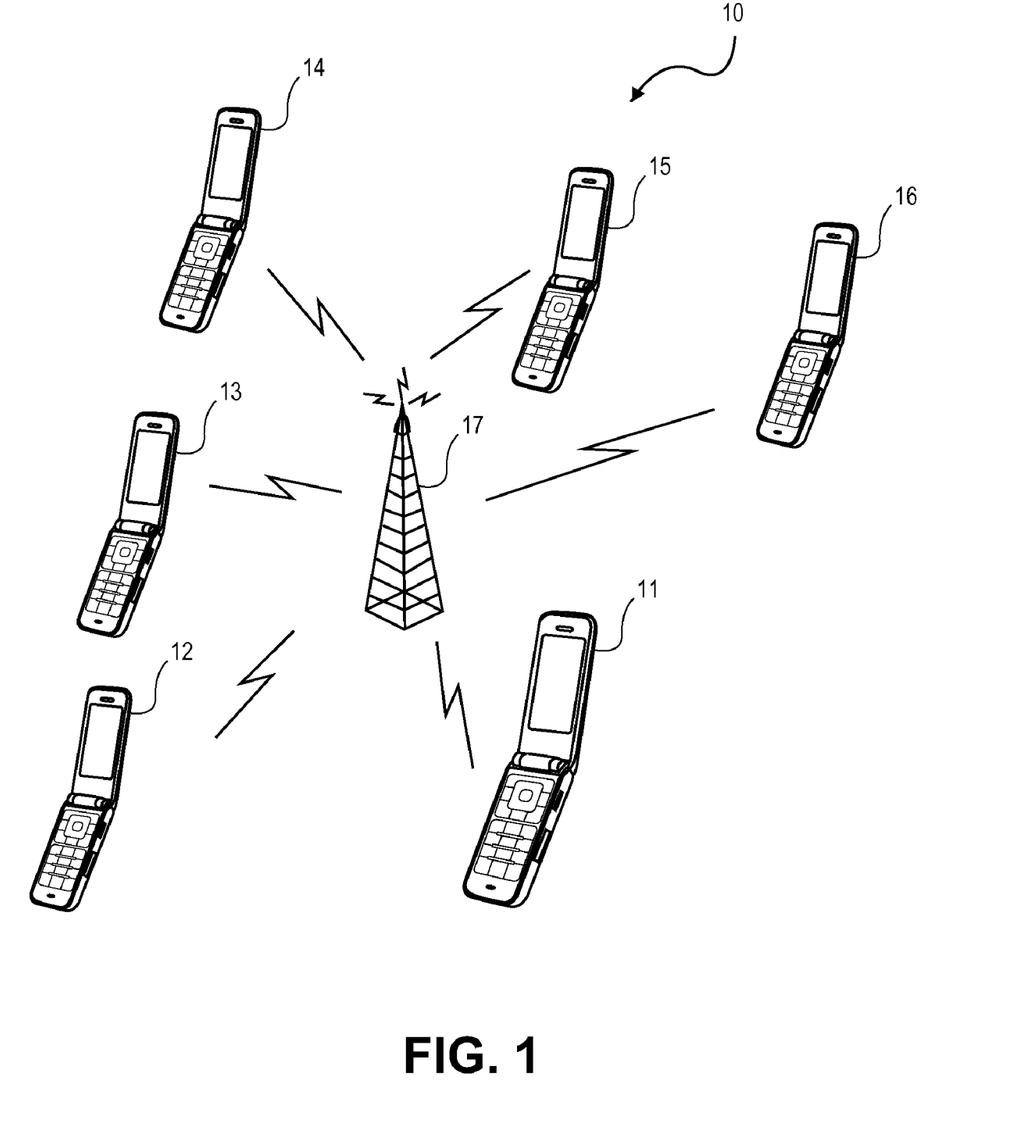
FIG. 1 is a block diagram of a wireless communication system, wherein a mobile phone device within the system may implement the present invention.

FIG. 1 illustrates a block diagram of an exemplary communication system 10 that includes a plurality of wireless communication devices 11-16 that communicate with a base station (BS) 17. In some systems, BS 10 may be referred to as Node B and in other situations, BS 17 may be an access point (AP). In the particular example, BS 10 operates as a base station for a mobile phone network, such as a cell phone system. As such, BS 17 is represented as a cell tower communicating with a plurality of mobile phones 11-16. Although six phones are shown in FIG. 1, the actual number varies within system 10. Each mobile phone or mobile station (MS) 11-16 communicates over the air independently with BS 17, but operates within the network of system 10 that is controlled by BS 17.

System 10 may operate using one or more of communication standard(s) or protocol(s). In the particular example described herein, system 10 operates within a mobile phone infrastructure in which BS 17 controls the amount of power generated from each of the MSs 11-16. One such communication system is the afore-mentioned WCDMA/UMTS network operating within the 3G standard. Other 3G networks include CDMA 2000, TD-SCDMA (3G standard of China), as well as others. However, the system need not be limited to CDMA/WCDMA operation and/or to a 3G standard. System 10 may be readily adapted for use in Long Term Evolution (LTE) or even in $4^{th}$ generation (4G) applications, as well as others.

In the context of a cell network, BS 17 of system 10 is affiliated with a radio network controller (RNC) that controls the various MSs in the cell network. In a WCDMA network there are multiple channels of operation and in FIG. 1, MS 11-16 are noted as operating within the same channel frequency for power transmission and in which power transmission from each MS 11-16 is controlled by BS 17. The modeling of system 10 is illustrated in FIG. 2.

Figure 2:
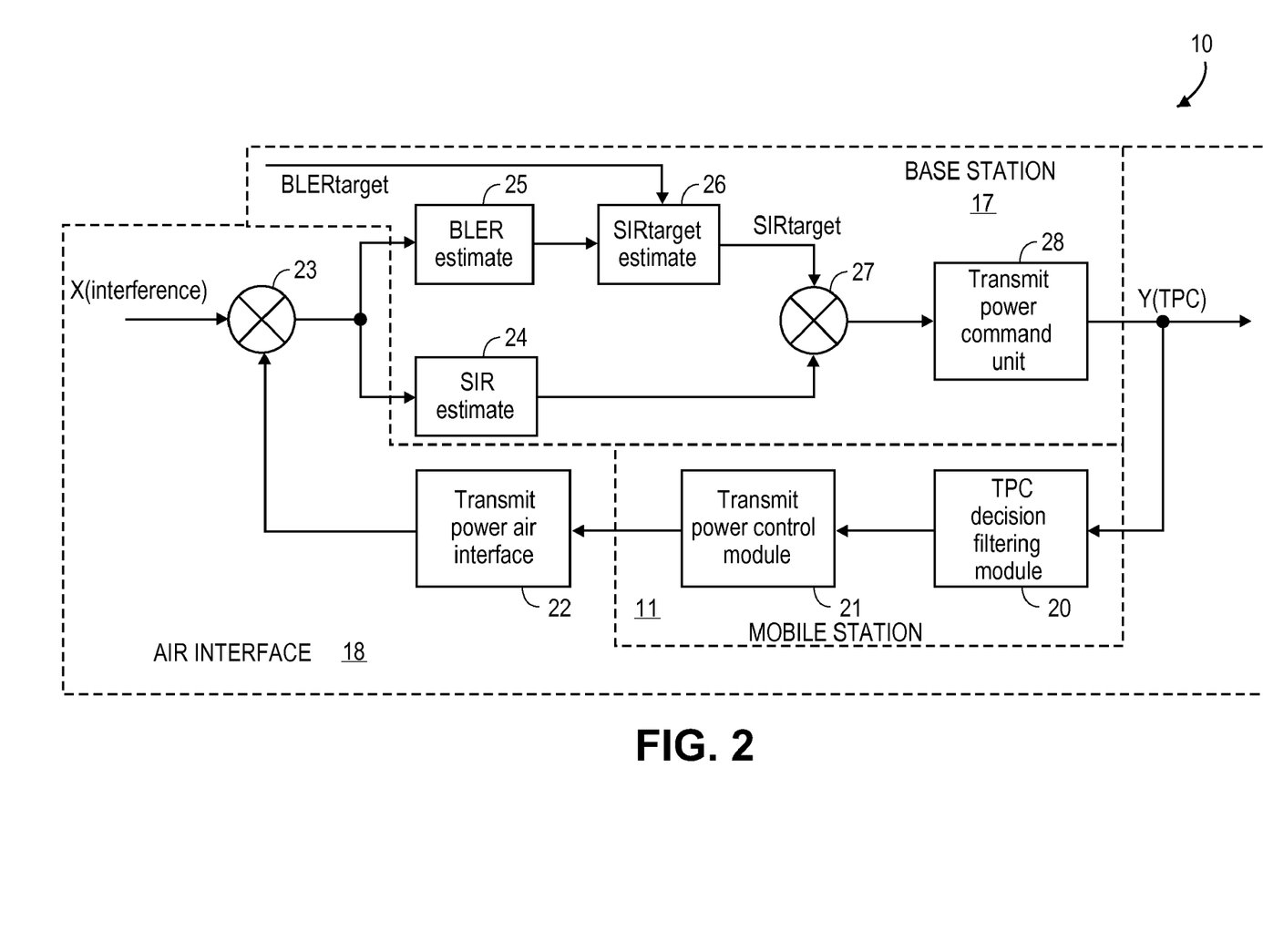
FIG. 2 is a block diagram illustrating a model of a closed loop power control when implementing the power control scheme of the present invention in a mobile station.

FIG. 2 shows the modeling of the air interface close-loop control between BS 17 and one of the mobile phones, such as MS 11, in order to provide transmit power control in the MS. It is generally understood for WCDMA operation that phones operating within the same channel frequency are capable of doing so because the signals are orthogonal. However, the signals of other phones appear as noise or interference, so that without proper power control over the network, quality of communication will not be maintained over the network. Accordingly, in order to control the power being transmitted from each phone, BS 17 sends a Transmit Power Control (TPC) command to each phone to direct how much power is to be transmitted from that phone.

FIG. 2 shows system 10 of FIG. 1, in which BS 17 communicates with a particular mobile phone (MS 11 in this instance) through an air interface 18. MS 11, BS 17 and air interface 18 are designated by dashed lines in FIG. 2. When MS 11 transmits a signal to BS 17 through air interface 18, the transmitted power (block 22) is combined with noise or interference X (block 23). Interference X is used to designate the mobile phones using the same transmit channel frequency for communication in the same cell network. As noted, in WCDMA networks, all phones using the same channel frequency to communicate within the network are treated as interference to other phones. BS 17 receives signals from all of the phones, including the transmitted signal from MS 11. An estimated block error rate (BLER), or alternatively a bit error rate (BER), is obtained (block 25) for the incoming signal from MS 11, along with an estimate for a signal interference ratio (SIR) (block 24). The BLER (or BER) is compared to a target BLER to obtain a target SIR (block 26), which is then compared to the SIR estimate (block 27). This comparison is coupled to a transmit command power unit 28 to generate an appropriate TPC command to MS 11 to request MS 11 to 1) decrease transmit power if the SIR estimate is greater than a predetermined SIR target threshold (meaning that the signal from the phone is greater than a threshold above the interference), 2) increase transmit power if the SIR estimate is less than a predetermined SIR target threshold (meaning that the signal from the phone is less than a threshold below the interference) or 3) maintain the same transmit power level if the SIR estimate is approximately at or near the SIR target (meaning that the signal from the phone is at a desired level near the interference level).

The adjusting of power levels at BS 17 to provide a similar quality of service to those phones operating within the network is generally known and various prior art practices are implemented at BS 17 to maintain the quality of the network. However, conditions never remain static so that the transmit power from MS 11 is constantly monitored and TPC commands are issued to correct for varying conditions to adjust the transmit power. Although a closed loop system between BS 17 and MS 11 is still required, it would be advantageous to have a self-compensating scheme within MS 11 itself in order to provide a tighter control over transmit power from MS 11. Accordingly, as shown in FIG. 2, a TPC decision filtering module 20 and a transmit power control module 21 are utilized within MS 11. As will be described below, TPC decision filtering module 20 operates on the TPC command from BS 17 to provide a decision process on how to respond to the incoming TPC command from BS 17. Transmit power control module 21 operates within the transmit signal path within MS 11 to provide compensation for variations in MS 11 that contribute to transmit power inaccuracy. By providing compensation over parameters that may be unique to the characteristics of the particular MS 11, transmit power from MS 11 in response to a TPC command may be made more accurate, resulting in higher efficiency in establishing and maintaining communication between MS 11 and BS 17.

It is to be noted that in one embodiment, techniques of both modules 20, 21 are utilized for transmit power control. In another embodiment, only the technique of module 21 is utilized. That is, the use of TPC filtering is desirable, but not necessarily needed in all instances to practice the invention.

Figure 3:
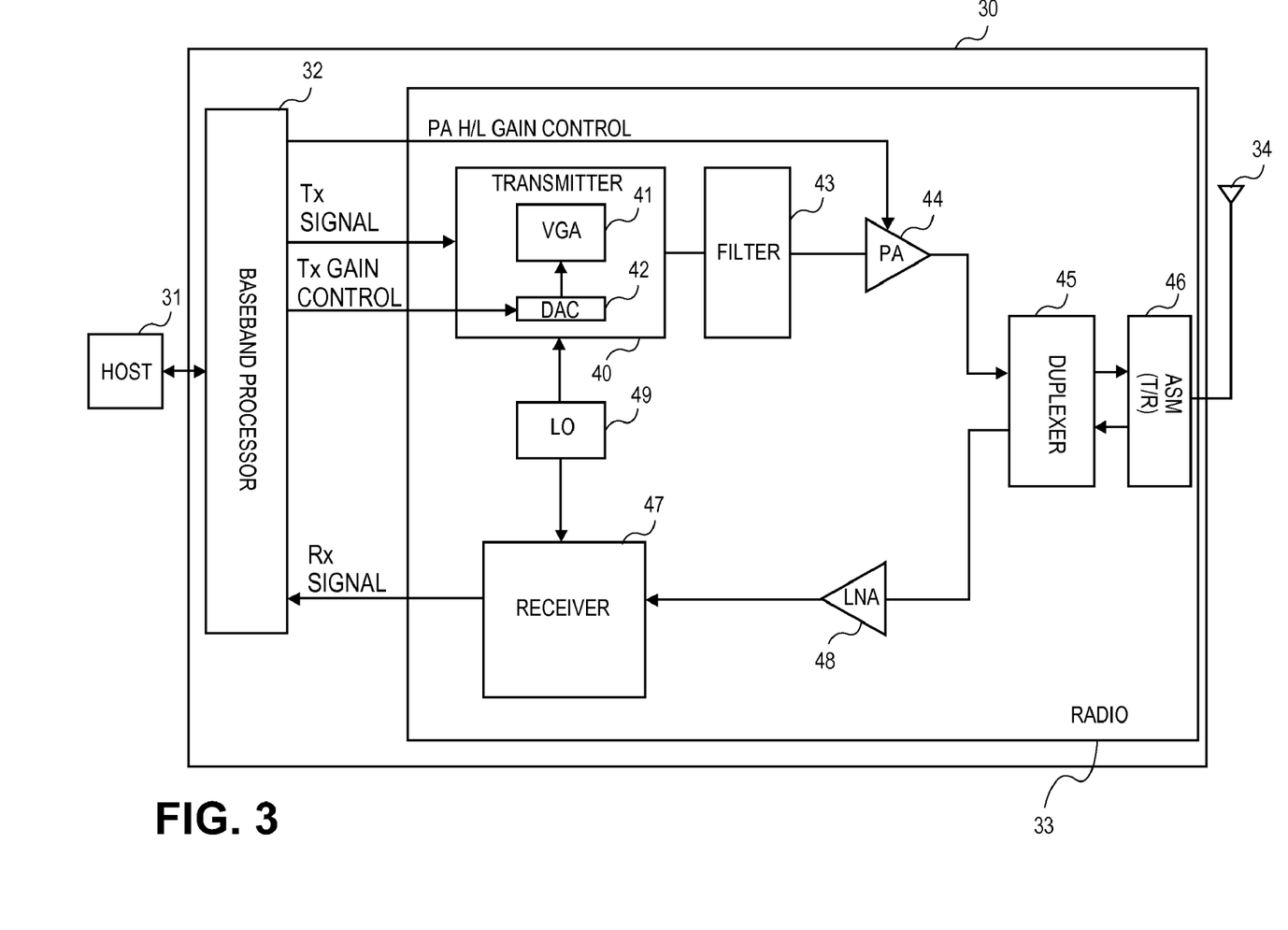
FIG. 3 is a block schematic diagram of a wireless mobile device showing one embodiment of a mobile phone for practicing the present invention.

FIG. 3 illustrates a block schematic diagram of a wireless communication device 30 that may be used as one implementation of MS 11. Accordingly, for the particular embodiment, wireless communication device 30 is referred to as mobile station (MS) 30. MS 30 includes a baseband processing module 32 and radio module 33 (hereinafter simply referred to as radio 33), which operate with host module 31. For mobile phones, such as MS 30, radio 33 is typically a built-in component. For PDAs, laptops, PCs or other wireless devices, radio 33 may be built-in or may be an externally coupled component.

Host module 31 generally includes those components that are utilized to provide a host function for the device. Accordingly, host module 31 may include or couple to various user interfaces, including, but not limited to, displays, hand operated devices (e.g. keyboards, keypads, mice, touch screen), speakers, headphones, microphones, etc. Host module 31 may also include a processor (e.g. central processing unit or CPU, micro-controller, etc.), memory and/or other components to provide the processing and related functions to operate device 30. For MS 30 operating as a mobile phone, host module 31 performs the corresponding operations of a mobile phone using a processor, which may also be referred to as an application processor.

Baseband processing module 32 (hereinafter simply referred to as baseband processor 32) couples host module 31 to radio 33 and provides baseband processing functions for both outgoing and incoming signals. For outgoing signals from host module 31, baseband processor 32 provides baseband processing of the outgoing signal and couples the outgoing digital signal for RF conversion by radio 33. For incoming signals, radio 33 converts an incoming RF signal to a digital baseband signal and couples the incoming signal to baseband processor 32 for further processing for use by host module 31. Although baseband processor 32 and radio 33 may be constructed as separate components, in the shown embodiment, baseband processor 32 and radio 33 are integrated on the same integrated circuit chip. In one embodiment, this integrated circuit is constructed using CMOS technology. In some embodiments, host module 31, or portions of host module 31, may also be integrated on the same integrated circuit chip.

Transmitter section of radio 33 includes a transmitter module 40, which typically includes a modulator or up-conversion module for conversion of a Tx (transmit) signal to a radio frequency (RF) signal. Transmitter module 40 includes some form of gain adjusting device or circuit and in this embodiment for MS 30, transmitter module 40 includes a variable gain amplifier (VGA) 41 to adjust the gain of the outgoing transmit signal. A transmit gain control module is utilized to provide the control for adjusting the gain value of VGA 41. In the particular embodiment, the transmit gain control module is a digital-to-analog converter (DAC) 42, in which a transmit gain control input from baseband processor 32 sets the output of DAC 42 to control gain settings for VGA 41.

The output of VGA 41 is coupled to a power amplifier module (PA) 44 via filter 43. A variety of filters may be implemented for frequency pass and/or rejection. In the particular embodiment a surface acoustic wave (SAW) filter is employed for filter 43. The output of PA 44 is coupled through a duplexer 45 to an antenna switch module (ASM) 46 for coupling to antenna 34. ASM 46 in some instances may be a simple transmit/receive (T/R) switch. Duplexer 45 and ASM 46 switch the antenna between transmit and receive functions. It is to be noted that although one antenna is shown, in some embodiments multiple antennae may be used. In some embodiments, radio 33 may operate in multiple-input, multiple-output (MIMO) mode using multiple antennae.

Furthermore, radio 33 may transmit using one gain mode only or multiple gain modes. In the shown embodiment, radio 33 transmits by using two gain mode, noted as a high (H) gain mode and a low (L) gain mode. The two gain modes are obtained by respectively setting the gain level in PA 44. the PA H/L gain adjustment is controlled by a PA H/L gain control signal from baseband processor 32. In addition, although single lines are shown in FIG. 3, signal transfer between the stages may be performed differentially, using differential circuits.

For receiving a signal, an inbound signal is received by antenna 34 and coupled to a low noise amplifier module (LNA) 48 via ASM 46 and duplexer 45. LNA 48 typically includes a low-noise amplifier for amplifying the incoming signal prior to down-conversion by receiver module 47. A variety of down-conversion or detection techniques, including direct conversion techniques, may be used to convert the incoming analog RF signal to a digital Rx (receiver) signal for coupling to baseband processor 32. A local oscillator (LO) 49 provides local oscillation signals to transmitter module 40 and receiver module 47 for up-conversion and down-conversion purposes. A variety of LOs may be used for LO 49, including frequency synthesizers.

As noted in FIG. 2, TPC decision monitoring module 20 and transmit power control module 21 provide for efficient and accurate transmit power control functions within MS 11. The operation of TPC decision monitoring module 20 is described below in reference to a filtering algorithm for TPC command sequence, while the operation of transmit power control module 21 is described below in reference to compensation algorithm and calibration scheme for adjusting the gain of VGA 41. It is to be noted that the specific examples described below are examples only and do not limit the invention to the described examples. The invention may be readily adapted to other devices, circuits, techniques that implement some form of closed loop transmit power control.

Filtering Algorithm for TPC Command Sequence

Generally for WCDMA phone operation, a power control sequence, in way of TPC commands, received by a mobile phone during a phone call or data transfer may be defined as TPC$\{i\}$, i=1, 2, ..., where i indicates a power control step. As an example, for each TPC command, transmit power may be increased or decreased by 1 dB, 2 dB or 3 dB steps, or alternatively, no change occurs (0 dB). Thus, TPC$\{i\}$=−1 dB, −2 dB, −3 dB, 0 dB, +1 dB, +2 dB or +3 dB. A problem with the normal TPC sequence is that there is a possibility for MS 11 to toggle up and down frequently due to TPC command fluctuation from BS 17. For example, BS 17 may issue a TPC command to have MS 30 decrease its transmit power by −2 dB in an existing time slot based on received power at BS 17. However, due to the fading variations and antenna diversity as described before, the next TPC command may request an increase of +2 dB, which may cause BS 17 power control to inefficiently toggle up and down following the TPC sequence fluctuation.

In order to prevent this toggling of the TPC command sequence, a filtering procedure, utilizing an algorithm-based routine, is implemented. In one embodiment, the filtering technique is implemented in baseband processor 32. A new power control sequence S$\{i\}$ is defined as the filtered output of TPC$\{i\}$ sequence, i=1, 2, ..., where i indicates a power control step. Sequence S$\{i\}$ is derived from TPC$\{i\}$ as follows:

For TPC$\{i\} \geq 0$ followed by TPC$\{i+1\} \geq 0$,
S$\{i\}$=TPC$\{i\}$
For TPC$\{i\} \leq 0$ followed by TPC$\{i+1\} \leq 0$
S$\{i\}$=TPC$\{i\}$
For TPC$\{i\} > 0$ followed by TPC$\{i+1\} < 0$, or TPC$\{i\} < 0$ followed by TPC$\{i+1\} > 0$
S$\{i+1\}$=0

The first two conditions ensure that two sequential commands are either stationary or moving in one direction (positive or negative). In this instance, the first command in the sequence is filtered as correct. The third condition signifies a toggling condition where the command sequence is moving in different directions. In this instance, transmit power is maintained the same. Thus, a toggling condition imposed by the TPC command sequence is detected and filtered to prevent the toggling. It is to be noted that the above filtering technique looks at two sequential TPC commands. In other embodiments, the filtering technique may evaluate more than two TPC command sequences. Furthermore, the filtering condition may be altered to provide other more complex conditions as well.

Error Compensation Algorithm and Calibration Scheme for Transmit Power Control

Figure 4:
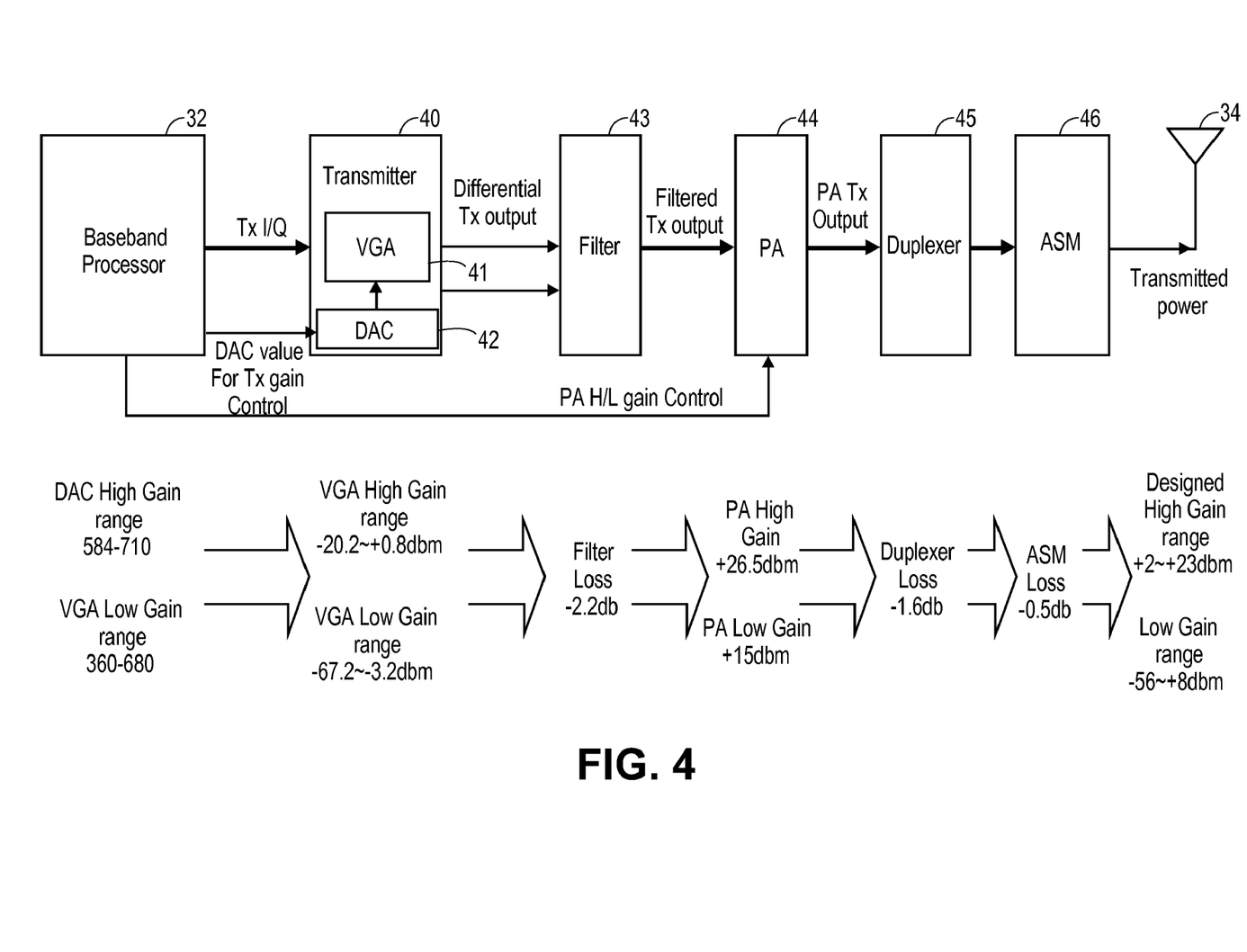
FIG. 4 is a block schematic diagram showing a transmitting path for the mobile phone of FIG. 3 and showing an example power gain/loss for each stage within the transmitting path.

The transmit power control technique that is implemented by MS 30 compensates for a number of parameters that cause variations in the circuitry utilized for transmission. FIG. 4 illustrates those circuit components of MS 30 that form the transmit power chain. In order to provide the compensation, the transmit power chain is first characterized by modeling. In this particular embodiment, filter 43 is a SAW filter and characterized as such. As noted other filters may be used and respectively characterized in the model. The model is based on the application of DAC 42 in which the output of DAC 42 provides an analog voltage that controls the gain of VGA 41. The compensation for transmit power variation is provided by baseband processor 32 in way of providing a compensated DAC control value to DAC 42. This DAC value is converted by DAC 42 to generate the control voltage to VGA 41. Thus, the model is centered around DAC 42 and the generation of the DAC value from baseband processor 32.

In one characterization of the model, each component of the transmit power chain is modeled as follows:
DAC (e,T,f,N)
VGA [DAC (e,T,f,N),T,f,N]
Filter (T,f,L,N)
PA (T,f,L,H/L gain,N)
Duplexer (T,f,L,N)
ASM (T,f,L,N)
where:

For the DAC:

e represents an error of the DAC and takes into account the total error of DAC 42, including DC offset error, gain error and other DAC errors.

T represents a temperature variable that affects the DAC value.

f represents a transmit channel frequency variable that affects the DAC value. However, for most cases, the DAC value is substantially independent from the transmit channel frequency, and therefore this effect may be ignored in most instances.

N represents a nonlinearity variable that affects the DAC value, which results in VGA gain changing nonlinearly in response to linearly changing input values to the DAC. However, the DAC's nonlinearity has slight impact to the DAC value and may be ignored in most instances.

For the VGA:

The VGA characterization also takes into account the DAC characterization DAC(e,T,f,N) described above and may be modeled together as VGA[DAC(e, T, f), T, f, N].

For the T, f, N parameters of VGA, other than the DAC:

T represents a temperature variable that affects the VGA value. The VGA gain is noticeably affected by temperature and is usually wide spread with large variations from phone to phone.

f represents a transmit channel frequency variable that affects the VGA gain value that manifests in a ripple frequency response.

N represents a nonlinearity variable that affects the VGA, which causes a nonlinear VGA gain response to a linear DAC input.

Figure 7:
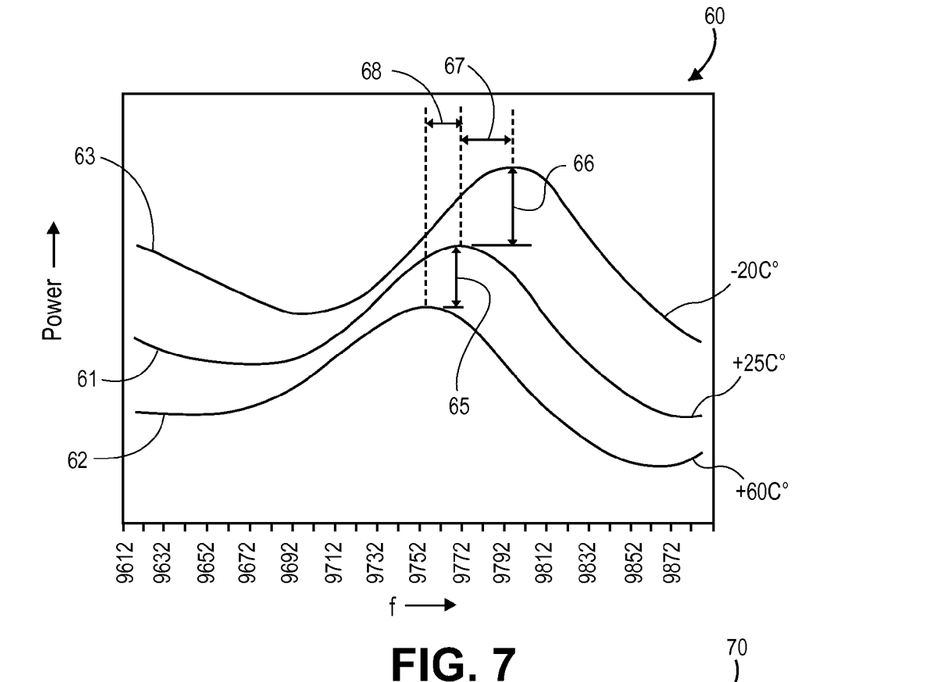
FIG. 7 is an example graph of a ripple frequency response versus power for three different temperatures to illustrate ripple frequency and ripple shift offsets due to frequency and temperature effects.

For Filter 43, as a SAW filter:

f represents a transmit channel frequency variable that affects the SAW filter to have a ripple frequency response as noted in FIG. 7.

T represents a temperature variable that affects the SAW filter transmit output value as a shifting of ripple frequency response, also shown in FIG. 7.

L represents a power loss variable that affects the SAW filter transmit output value and is usually caused by the SAW filter itself and its layout.

N represents a nonlinearity variable that affects the SAW filter transmit output value, which changes nonlinearly with SAW filter input.

For the PA:

f represents a transmit channel frequency variable that affects the PA power value as a combination of the ripple frequency response and power loss versus the channel frequency.

T represents a temperature variable that affects the PA power value as the combination of the ripple frequency response and power loss versus the channel frequency.

L represents a power loss variable that affects the PA transmit output value and is usually caused by the PA itself and its layout.

H/L gain represents a power gain control variable that affects the PA output power due to the different characteristics between the high gain and low gain settings for the PA.

N represents a nonlinearity variable that affects the PA transmit output value on either of the high/low gain setting.

For the duplexer:

f represents a transmit channel frequency variable that affects the duplexer output power value as the combination of the ripple frequency response and power loss versus the channel frequency.

T represents a temperature variable that affects the duplexer output power value.

L represents a power loss variable that affects the duplexer output power value and is usually caused by ASM itself and its layout.

N represents a nonlinearity variable that affects the duplexer TX output value.

For the ASM:

f represents a transmit channel frequency variable that affects the ASM output power value as the combination of the ripple frequency response and power loss versus the channel frequency.

T represents a temperature variable that affects the ASM output power value.

L represents a power loss variable that affects the ASM output power value and is usually caused by ASM itself and its layout.

N represents a nonlinearity variable that affects the ASM output value.

When all of these factors are taken into consideration, significant causes for the major variations may be reasonably attributed to four dominating error contributors, which are;

1) Ripple error at a certain temperature versus various channel frequencies. All possible ripple frequency response contributed from VGA, SAW filter, PA, duplexer and ASM may be taken into account as a whole error contribution, although the SAW filter usually contributes the most to this error. This error may be considered as a fixed error offset at each frequency point versus a central frequency point (or some other set point) and is isolated from nonlinearity error.

2) Ripple error versus channel frequency with varying temperature. All possible ripple frequency response with varying temperature contributed from VGA, SAW filter, PA, duplexer and ASM may be taken into account as a whole error contribution versus temperature, although the SAW filter usually contributes the most to this error. This error may be considered as a variable error that may be added on to the ripple error at a certain temperature and is also isolated from nonlinearity error.

3) Power error at a certain temperature may be taken into account as a variable error contributed by the DAC error and the VGA gain error in a certain linear range. The transmit power loss and nonlinearity from SAW filter, PA, duplexer and ASM may also be considered as contributing to this error. This error typically has wide spread variations for both gain and gain slope from phone to phone.

4) Power error that varies with temperature may be taken into account as a variable error contributed by the DAC error and VGA gain error that is added on to the VGA error at a certain temperature. The transmit power loss and nonlinearity that varies with temperature from the SAW filter, PA, duplexer and ASM may also be considered as contributing to this error.

Because an accurate transmit power control operation is performed by setting correct DAC values for the various desired transmit power settings, power compensation may be performed to provide compensation and offset adjustments at DAC 42 that sets the gain of VGA 41. Accordingly, various calibrations may be performed to determine the variations in the transmit power across various temperature values, power level settings and channel frequencies to compare the actual transmitted power output to the expected transmit power output. Where discrepancies exist, a circuit or a routine may provide the requisite compensation to bring the actual transmitted power value to the expected transmitted power value.

In one embodiment of the invention, an algorithm-based routine in baseband processor 32 provides the compensation by adjusting the input value to DAC 42 to adjust the gain of VGA 41 to correct the error. In one embodiment of the invention three compensation adjustments are made. These three adjustments are noted as follows:

a) Compensated_DAC is a calculated DAC value based on factory calibration at a specified temperature when a factory calibration is performed.

b) Ripple_offset@temperature is a DAC offset value associated with ripple frequency response and temperature.

c) DAC_offset@temperature is a DAC offset value associated with changes in temperature.

Error Compensation Algorithm and Calibration Scheme for Transmit Power Control

I. Compensated_DAC Value

The initial or base value to be determined for a DAC setting is the compensated DAC value for a desired or expected transmit power output from radio 33. In order to perform this function, the transmitter chain noted in FIG. 4 is evaluated for gains and losses through the various stages. This evaluation may be done for one gain mode or, alternatively, for multiple gain mode. In the example described above, two transmit gain modes (H gain and L gain) were noted, so the evaluation is made for each gain mode. An example gain/loss analysis for each gain mode through each stage of the transmitter chain is shown in lower portion of FIG. 4. Note that there is an overlap between the two gain ranges. It is to be noted that the shown values are for exemplary purpose and that other embodiments will have other values. Furthermore, filter 43 is assumed to be a SAW filter.

As noted PA 44 has two gain values to denote its amplification factors. High gain value is approximately +26.5 dBm and low gain is approximately +15 dBm. Filter 43 has a negative gain (power loss) of approximately −2.2 dB for both H and L gain modes. Duplexer 45 has a loss of approximately −1.6 dB for both gain modes. ASM 56 has a loss of approximately −0.5 dB for both gain modes. Assuming that a transmit power output of approximately +2 dBm to +23 dBm is desired for the H gain mode and a transmit power output of approximately −56 dBm to +8 dBm is desired for the L gain mode, an approximate output from VGA 41 for each band can be calculated, as noted in FIG. 4. Working backwards, the corresponding VGA output transmit power can be calculated as High gain: (+2~+23 dBm)+0.5 dB+1.6 dB−26.5 dBm+2.2 dB=(−20.2~−0.8 dBm)

Low gain: (−56~+8 dBm)+0.5 dB+1.6 dB−15 dBm+ 2.2 dB=(−67.2~−3.2 dBm)

In one embodiment, the associated DAC 42 input range from baseband processor 32 is in the approximate range of 584 to 710 for the H gain mode and the approximate range of 360 to 680 for the L gain mode. Again these values are presented for exemplary purpose and other embodiments will have other input values to DAC 42.

Because the relationship between the DAC value and the transmit power at antenna 34 forms two theoretical straight lines for high gain and low gain respectively, it follows that:

Power_$H$=0.167*HDAC_value−95.33 (dBm)    (Equation 1)

Power_$L$=0.2*LDAC_value−128 (dBm)    (Equation 2)

where, 0.167=(23−2)/(710−584)→0.167 dBm per one DAC value for high gain 0.2=(8−(−56))/(680−360)→0.2 dBm per one DAC value for low gain Equations 1 and 2 may also be expressed as:

HDAC_value=6*Power_high+572(DAC value)    (Equation 3)

LDAC_value=5*Power_low+640(DAC value)    (Equation 4)

where,

6=(710−584)/(23−2)→DAC value per 1 dB power for high gain

5=(680−360)/(8+56)→DAC value per 1 dB power for low gain

Since the DAC values are used to control the transmit power, Equations 3 and 4 are utilized as the predetermined theoretical straight line response of DAC value versus transmit power level for determining the Compensated_DAC value.

Accordingly, for each gain mode, a linear interpolation may be made between a given DAC input value and expected transmit power output that is compensated for gain/loss through the transmit chain. Although a single linear relationship may be established to provide a compensated DAC value for each gain mode, one embodiment of the invention divides each gain mode into sections. Having multiple sections allows for adjustments at various points in the event the DAC value versus transmit power relationship is not completely linear.

Figure 5:
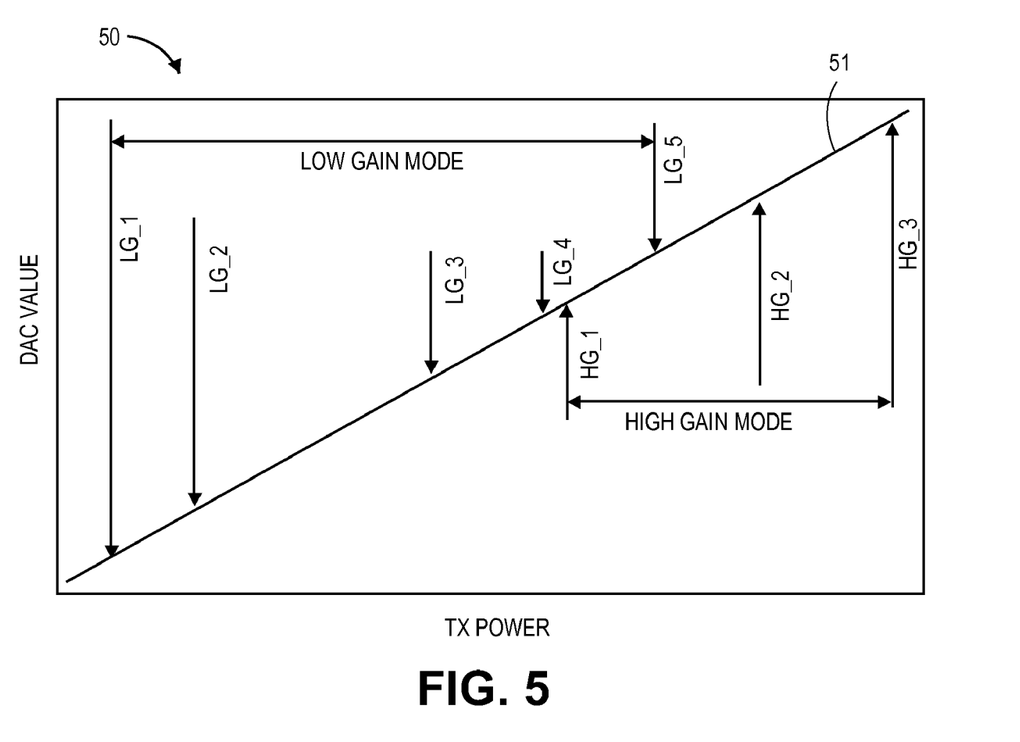
FIG. 5 is a transmit power output graph for two transmitting bands and showing separation of each band into multiple sections to determine compensated DAC values.

FIG. 5 shows a typical graph 50 of DAC value versus transmit (TX) power from VGA 41 for both H and L gain modes. The DAC values and TX power values are shown as arbitrary values, since these values will depend on the particular embodiment utilized. For example, in one embodiment, the DAC values and the power values may take on the values described above. That is, DAC values reside approximately between 360 and 710 across the both H and L gain ranges. Curve 51 of graph 50 shows this relationship. When curve 51 is substantially linear across the whole range, a linear interpolation may be made to determine a DAC value for a given TX power value, or vice versa. However, because of nonlinearity in the response, curve 51 may not be linear across the whole range. In order to improve the interpolation, each of the H and L bands are sub-divided into multiple sections. In graph 50, the L gain mode is divided into four sections and the H gain mode is divided into two sections. The boundaries of the sections are noted as LG_1 through LG_5 for the L gain mode and HG_1 through HG_3 for the H gain mode. Subsequently, when calculating a particular DAC value for a given TX power value, a linear interpolation is made between the two boundary values that contain the relevant point.

Figure 6:
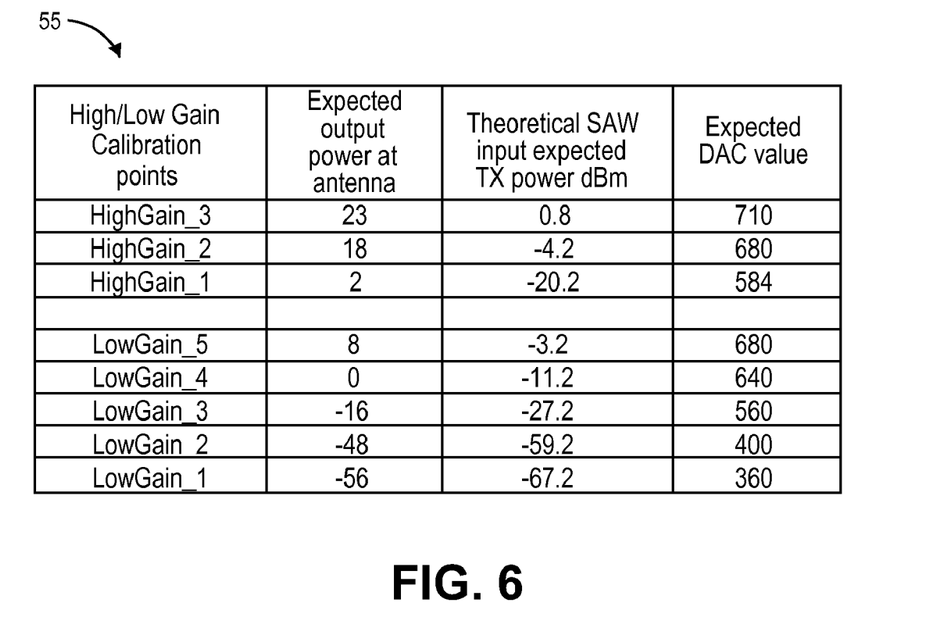
FIG. 6 is an example look-up table that is used to obtain compensated DAC values for the two transmitting bands shown in FIG. 5.

FIG. 6 shows a look-up table 55 that cross references each of the boundary values to the DAC value, TX power out of VGA 41 and power at antenna 34. Values obtained through experimentation and calibration for DAC-power profile are stored in a storage medium, such as a memory device that is accessed by baseband processor, as entries of look-up table 55. When in operation, baseband processor 32 accesses table 55 to determine the two boundary points associated with a particular transmit power level for a given gain mode, as well as the expected DAC values for those boundaries. Then, an interpolation technique, such as a straight-line linear interpolation, may be used to determine the interpolated DAC value for the particular transmit power level between the two boundary points of that gain mode. It is to be noted that various other techniques may be employed to associate a particular TX power value to a DAC value.

As noted above, the number of sections and boundary points for each gain mode varies depending on the embodiment and in some embodiments, there may only be one section per gain mode or one section across the complete range of operation. The granularity of the DAC values may vary according to the embodiment employed and in one embodiment, the granularity is set for 1 dB step in the power change. The DAC value obtained from the above-described technique, such as the interpolated DAC value from table 55, is the compensated DAC value. Thus, the compensated DAC value compensates for the various circuit gains/losses in the transmit power chain for a given expected output power at the antenna.

II. Ripple_Offset@Temperature

Even after adjusting for compensation of the DAC value, the circuitry in the transmit chain still experiences variations due to changes in temperature and channel frequency. That is, when the phone circuitry is calibrated (such as at a factory), the phone is typically calibrated at an ambient temperature at a factory and a selected frequency (e.g. center channel frequency) to obtain the compensated_DAC values. However, the phone may operate at a different channel frequency and the ambient temperature may change. Accordingly, FIG. 7 illustrates what happens to the transmit power when channels and temperatures change.

FIG. 7 shows a graph 60 with three curves 61, 62, 63. Curve 61 illustrates what happens to transmit power as channel frequency varies. When characterization is performed, such as at a lab, a particular channel frequency is chosen for the calculation. Typically, the selected channel is a channel at or near the center of the frequency band of operation for the phone. For curve 61, this central calibration channel may be channel 9752, as illustrated. Without changing the power input values (e.g. input remains substantially constant), curve 61 shows the output power response versus the channel frequencies. That is, the power output is not constant across the channel frequencies.

In addition, curves 62, 63 illustrate what happens if the temperature is also changed. Curve 62 shows the output power response at +60 C.° and curve 63 shows the output power response at −20 C.°. That is, curve 61 at +25 C.° transitions to curve 62 at +60 C.° and transitions to curve 63 at −20 C.°. As shown in graph 60, when temperature increases, the ripple effect shifts curve 61 to the left (shown by double-pointed arrow 68) and lowers the overall power level (shown by double-pointed arrow 65). Alternatively, when temperature decreases, the ripple effect shifts curve 61 to the right (shown by double-pointed arrow 67) and raises the overall power level (shown by double-pointed arrow 66).

The ripple_offset@ temperature adjustment is performed by first obtaining the various data points across the channel frequencies at a specified temperature, such as at +25 C.° to obtain the base curve, such as curve 61. Subsequently, similar data points are obtained at specified other temperatures. Graph 60 shows two other set of data points, one at +60 C.° and the second at −20 C.°. Data points may be obtained at other temperatures as well. A final result is a determination of output power across different channel frequencies at different temperatures. In one embodiment, this process may be performed on multiple phones and the results averaged to obtain an average response across all similar phones.

It is noted through experimentation that the ripple shift to the right or left is a relationship of channel frequency "f" to temperature "t". That is, a point on curve 61 shifts right/left a certain approximate amount of "f" for a given change in temperature "t". Stated differently, a channel frequency shifts a channel to the right/left for every respective X° change in the temperature. Additionally, it is noted through experimentation that the ripple frequency response is independent of the power level, so that a change in the value of the input power value does not substantially affect the ripple response.

Figure 8:
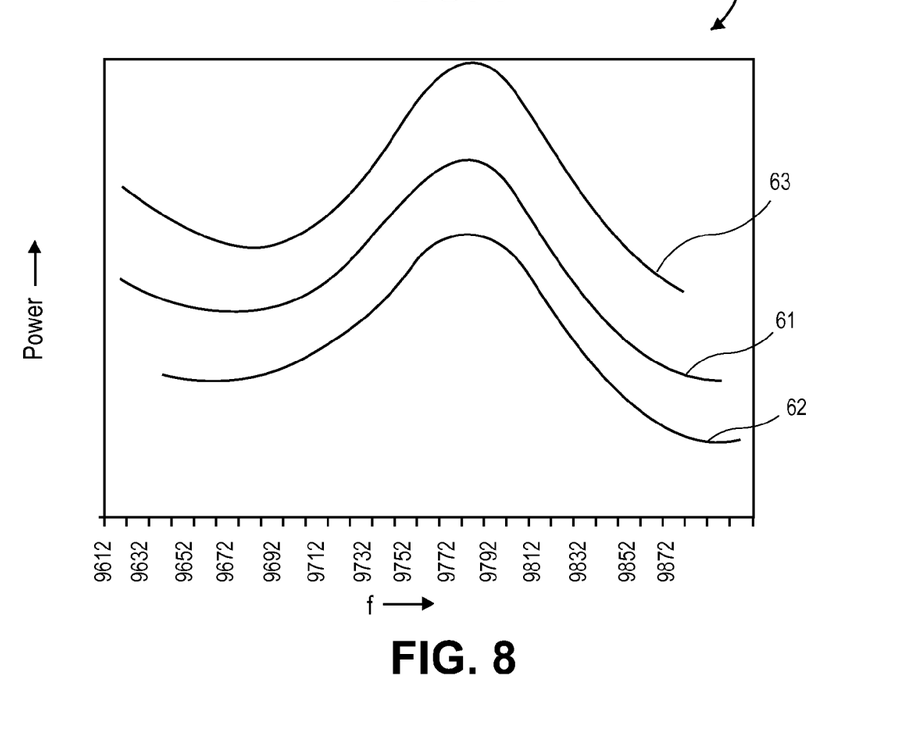
FIG. 8 is a graph of frequency versus power for the three curves of FIG. 7 when ripple shift is compensated.
Figure 9:
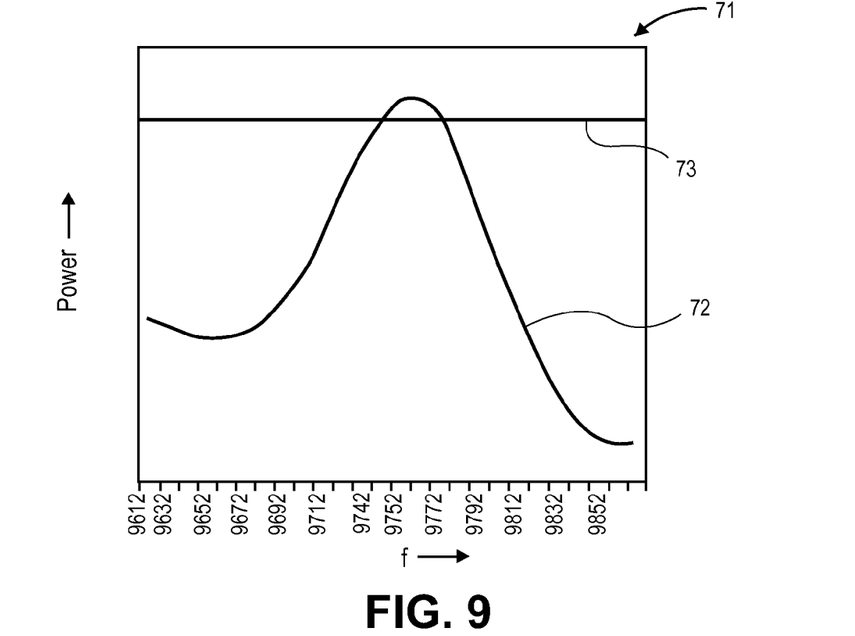
FIG. 9 is a graph of frequency versus power for one of the curves of FIG. 8 once ripple frequency is compensated.

The ripple offset adjustment is a two adjustment process to correct for the power variation across the channel frequencies (e.g. ripple frequency) and to correct for the ripple shift due to temperature effects. The ripple shift adjustment ensures that the ripple shift due to variations in operating temperature are adjusted. Essentially, the ripple shift adjustment would align the different curves 61-63 as shown in FIG. 8, so that the only offset noted is a vertical displacement due to temperature. The ripple frequency adjustment is performed to smooth out the ripple, so that the power level is substantially uniform across the channel frequencies, as illustrated in FIG. 9. In FIG. 9, graph 71 shows a ripple response curve 72 (which may be curve 61 of FIG. 7 or 8) being corrected to have a substantially flat power output response. The resulting correction across the frequency band is shown as curve 73.

Referring to FIGS. 7-10, through experimentation and calibration, a transmit power level response curve is determined across the channel frequencies of operation at a designated temperature, such as at +25 C.°. Curve 61 or 72 exemplifies such a response curve. Since the DAC value is used to set the transmit power, the ripple frequency adjustment corrects for power differences across the transmit frequency band by offsetting the DAC input value, so that the end result is a substantially uniform transmit power output, as noted by curve 73 in FIG. 9.

The ripple frequency offset values are determined and stored in a look-up table. One embodiment of a look-up table for ripple frequency offset is shown as table 75 in FIG. 9. A reference channel is selected as a reference point. Usually, a channel near the center of the frequency band is utilized as the reference channel. For example, in the FIGS. 7-10, channel number 9752 is selected as the reference channel. Thus, the offset at channel 9752 in table 75 is zero. Offset values for some of the other channel frequencies are noted in table 75. The offset values of table 75 are used to adjust the initial compensated_DAC input value, so that a substantially smooth transmit power output is obtained across the channel frequency band.

Figure 10:
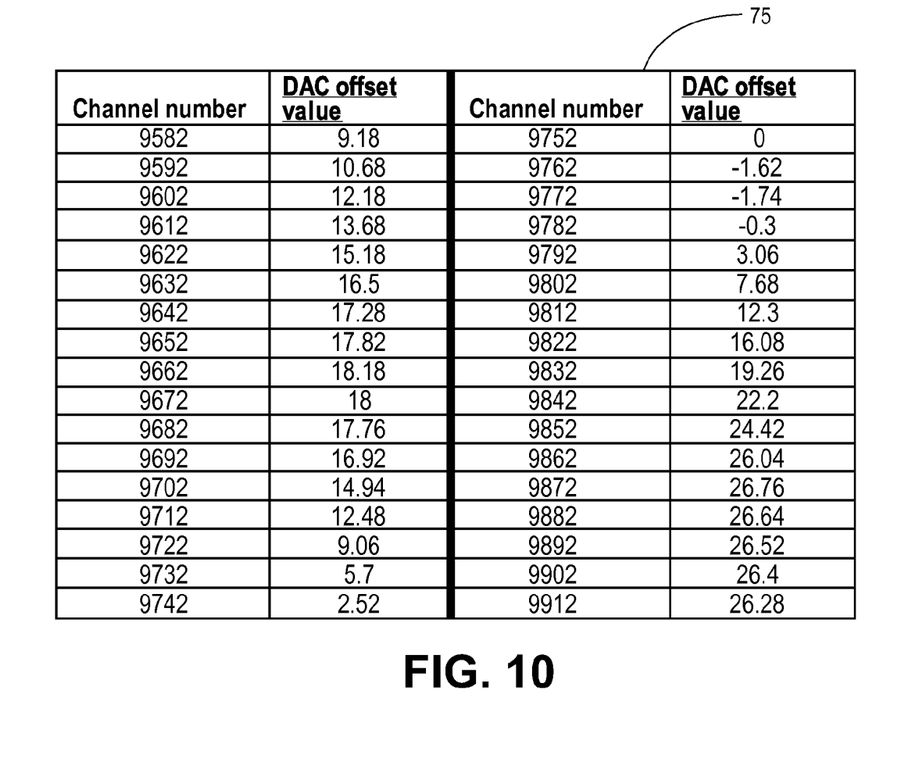
FIG. 10 is an example look-up table that is used to obtain ripple offset values when ripple compensation of FIGS. 8 and 9 are applied.

It is appreciated that table 75 is shown for the H gain mode in the above-described example and an equivalent table is also generated for the L gain mode. Furthermore, the number of entries in table 75 may vary in different embodiments and the granularity of the channel entries having offset values provided in the ripple frequency offset table, such as table 75, may also vary in different embodiments. In some instances, linear interpolation may be used to select an offset value for a channel frequency not having an entry in table 75.

Once ripple frequency offset at 25 C.° has been performed to obtain table 75 for the H gain mode and a similar technique to obtain an equivalent table for the L gain mode, the power level adjustment is corrected across the frequency band. However, the ripple shift effect at temperatures other than +25 C.° still needs to be offset. The ripple shift due to temperature, as shown by curves 61-63, generally has a relationship of f/C. That is, the ripple shift can be categorized as "x" number of shifted channels per degree C. (or alternatively, a ripple shift of one channel for every "m" number of degrees). The direction of the shift will depend on the increase or decrease of temperature from +25 C.°.

In one embodiment of the invention, ripple shift calibrations are made at multiple different temperatures, such as at −20 C and +70 C, to determine a channel frequency shift correlation to changes in temperature. In one implementation, the ripple shift has a correlation of approximately 40 C.° change for a change over 20 channel numbers. Stated differently, for each 1 C.° change in temperature, the channel shift is approximately 0.5 channel numbers. The direction of the channel number shift will depend on the direction of the temperature change.

Once this correlation is noted, the information is stored and used to adjust the selection of the entry from table 75. For example, using the 20 ch./40 C.° correlation above, if the operating temperature is +45 C.°, the ripple shift is −10 channels [(45 C.°−25 C.°)×(20/40)]. Since the ripple shift is to the right by 10 channels at +45 C.°, this difference is noted when obtaining the entry in table 75. Thus, if the phone is operating at channel number 9722 at +45 C.°, then the DAC offset entry for channel number 9712 is retrieved (instead of entry for channel number 9722) in order to account for the ripple offset. In the instance, the tail of the curve extends beyond the first or last entries in table 75, the offset values may be linearly extended and interpolated to obtain the DAC offset value from table 75.

It is to be noted, that the ripple offset and temperature (e.g. as described in reference to the graphs of FIGS. 7-9 and table 75 of FIG. 10) are performed at a lab and is typically calculated at 25 C.° (e.g. by placing a phone in a temperature chamber at)25 C.°. However, the factory calibration for DAC value at a central frequency point is performed at ambient temperature with a board (e.g. circuit board) temperature that is usually not at 25 C.°, which also causes the shifting for ripple offset and this should be taken into account for compensation. In other words, a delta offset value is taken into account when table 75 is used to do the ripple compensation. During factory calibration for DAC value(s) at a central frequency point, the temperature reading during calibration is saved as Cal_temp and Cal_temp is taken into account for ripple shifting.

Accordingly, a ripple frequency adjusted DAC value from table 75 provides the ripple_offset@temperature and this offset value is then algebraically added to the compensated-_DAC value described under section I above. Subsequently, a DAC_offset@temperature adjustment is made.

III. DAC_Offset @Temperature

The ripple_offset@temperature offset adjustment above corrects for the frequency ripple and the ripple shift, but the difference in the power lever at different temperatures has not yet been corrected. That is, in FIG. 7, the difference in the power level for curves 62, 63 need to be corrected, since the compensated_DAC value of section I above are determined at +25 C.°. It is to be noted that the power level variations up or down from curve 61 generally has a linear relationship to temperature, somewhat similar to the ripple shift. Accordingly, a correlation may be established between power level and temperature. For example, after aligning the peak gain at or near a center frequency (such as channel 9752) for the H gain mode, calibrations are made at +70 C and at −20 C.°. A correlation is then determined between the power level and temperature. For example, when temperature changes, every 5 C.° increase in temperature may cause an approximate 0.4 dB decrease in power and every 5 C.° decrease in temperature may cause an approximate 0.4 dB increase in power. This correlated value is calculated out and later used to provide the DAC_offset@temperature compensation. Essentially, curves 62, 63 of FIG. 8 are adjusted to offset the power level difference due to temperature.

The derived DAC_offset@temperature offset is then algebraically added to the compensated_DAC value of section I and the ripple_offset@temperature value adjustment of section II to obtain a final compensated and offset input value for DAC 42. It is to be noted that the DAC_offset@temperature value is typically separately obtained for the H gain mode and for the L gain mode. Furthermore, the separate correlated values may be obtained for different temperature ranges. For example, with the above described example, one correlated values may be obtained for the range +25 C.° and +60 C.° and a second correlated value obtained for the range +25 C.° and −20 C.°. In addition, although only two temperature ranges are noted, there may be more divisions of temperatures to extend the number of temperature range correlations that may be used. In one embodiment, the various correlated values are either stored in a look-up table and/or calculated through software, which is accessed by baseband processor 32.

Mobile Phone Operation

Once the compensated_DAC values, ripple_offset@temperature values and DAC_offset@temperature value(s) are generated through calibration and experimentation, these values are stored within the phone. Typically a storage medium, such as a memory device, in or associated with broadband processor 32, stores the reference or look-up tables that contain the compensated_DAC values and the ripple frequency offset values. The ripple shift value and the DAC offset value(s) may be stored as entries in a look-up table and contained in the memory as well, or alternative, in a separate storage medium, such as a register. Yet still, various value(s) may be included within the algorithm that is used by baseband processor 32 to provide the compensation and offset when in operation.

Figure 11:
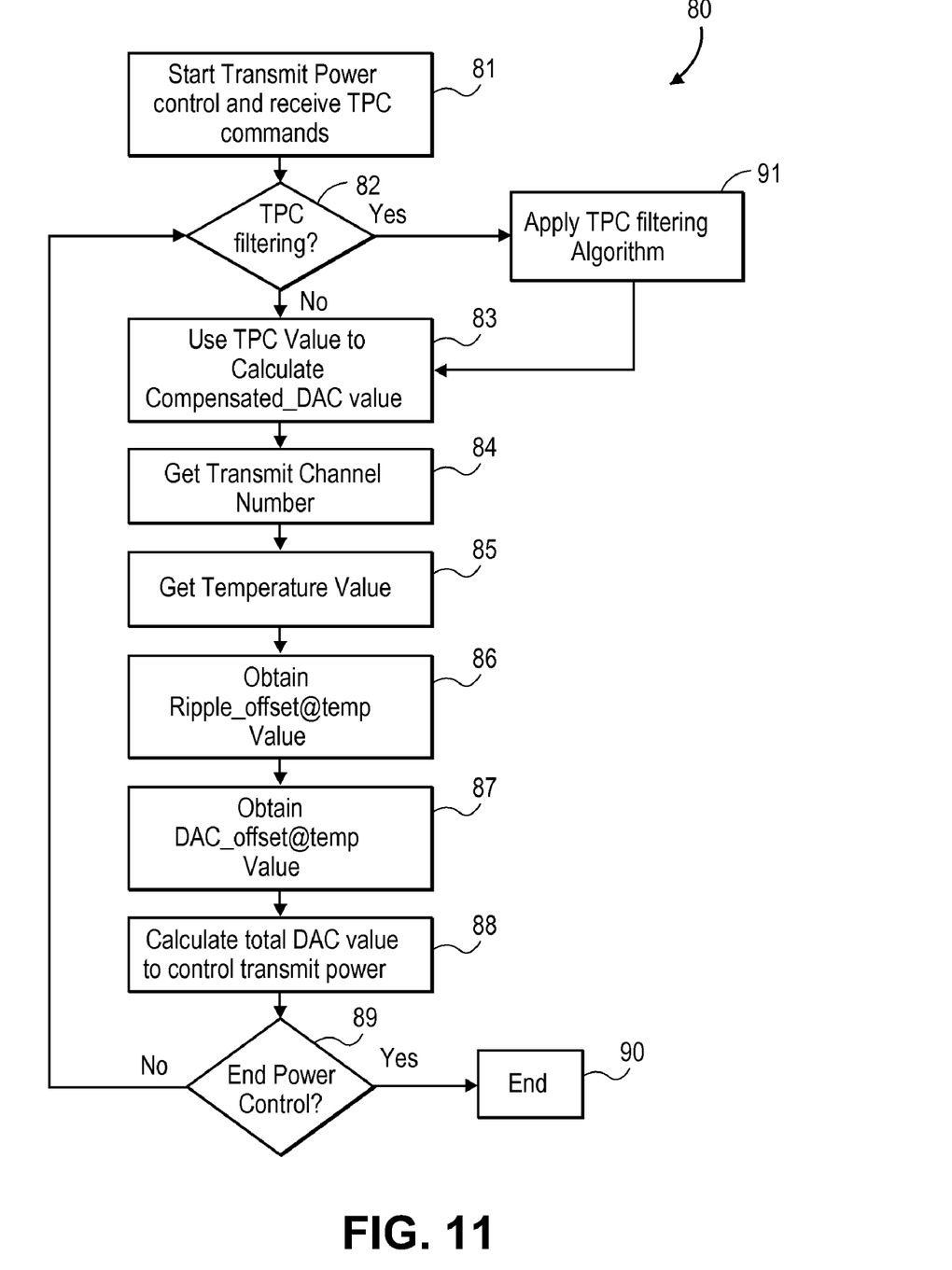
FIG. 11 is a flow chart showing the operation of a mobile phone in applying the various power compensation schemes in practicing one embodiment of the present invention.

FIG. 11 shows a process 80 performed by baseband processor 32 in response to a TPC command from a base station. In one embodiment a program running an algorithm performs process 80. When transmission is to occur, a mobile station initiates a transmit power control routine and receives a TPC command from BS 17 (block 81). Then, if TPC filtering is used (block 82), the TPC filtering algorithm is applied (block 91) and multiple TPC commands are evaluated pursuant to the particular algorithm. If TPC filtering is not used, then the algorithm (block 91) is ignored. Then, the TPC value, or the filtered TPC value (if TPC filtering is active) is used to calculate the compensated_DAC value pursuant to the description of section I above (block 83). Next, the transmit channel number (block 84) and the temperature value (block 85) are obtained. Subsequently, appropriate ripple_offset@temperature value is obtained pursuant to the description of section II above (block 86), followed by obtaining the appropriate DAC_offset@temperature value pursuant to the description of section III above (block 87).

Then, the total DAC value is calculated from the combination of the compensated_DAC value, ripple_offset@temperature value and the DAC_offset@temperature value (block 88) to obtain the total compensated offset input value to the DAC. The process next looks to determine if the power control routine is to end (block 89) and ends the routine (block 90) or returns to TPC filtering block 82 (or alternatively to block 83, if no TPC filtering is used), if transmission is to continue. The total compensated offset provided in the phone allows the phone to have its control over the transmit power.

Accordingly, a mobile phone or station with efficient and accurate transmit power control is described.

As may be used herein, the terms "substantially" and "approximately" provides an industry-accepted tolerance for its corresponding term and/or relativity between items. Such an industry-accepted tolerance ranges from less than one percent to fifty percent. Such relativity between items ranges from a difference of a few percent to magnitude differences. As may also be used herein, the term(s) "coupled" and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more its corresponding functions and may further include inferred coupling to one or more other items.

The embodiments of the present invention have been described above with the aid of functional building blocks illustrating the performance of certain functions. The boundaries of these functional building blocks have been arbitrarily defined for convenience of description. Alternate boundaries could be defined as long as the certain functions are appropriately performed. One of ordinary skill in the art may also recognize that the functional building blocks, and other illustrative blocks, modules and components herein, may be implemented as illustrated or by discrete components, application specific integrated circuits, processors executing appropriate software and the like or any combination thereof.

We claim:

1. A method comprising:
   determining input values to a digital-to-analog converter (DAC) for a plurality of transmit power levels for a gain control circuit at a selected transmit frequency and at a selected temperature, in which the input values compensate for power gains and losses in transmitter stages utilized for transmitting a signal, wherein the DAC is used to control gain of the gain control circuit;

storing the input values and respective power levels;
identifying a variation in a level of the transmit power level at frequencies other than the selected transmit frequency as a ripple across a frequency band;
determining a ripple offset value at each of a plurality of frequencies across the frequency band to substantially smooth the ripple;
storing the ripple offset values;
identifying a shift in the ripple across the frequency band at temperatures other than the selected temperature of operation;
determining a correlation between the ripple shift and a change in temperature;
storing the correlation between the ripple shift and the change in temperature;
identifying a difference in the transmit power levels at temperatures other than the selected temperature;
determining a correlation of the transmit power level between the other temperatures and the selected temperature;
storing the correlation of the transmit power level between the other temperatures and the selected temperature; and
providing a routine to run on a processor to select one of the input values corresponding to an expected transmit power output for transmitting the signal in response to a received transmit power control instruction to control a power output level for transmitting the signal, modifying the input value by offsets provided by a ripple offset value, correlation between the ripple shift and the change in temperature, and correlation between the transmit power level and temperature to adjust for variations within the transmitter stages for input to the DAC.

2. The method of claim 1, wherein the transmit power control instruction is sent from a base station.

3. The method of claim 1, wherein providing the routine to process the received transmit power control instruction further includes the routine to filter a sequence of at least two consecutive transmit power control instructions and to respond to a first of the transmit power control instructions only when the at least two consecutive transmit power control instructions do not toggle to command a transmit power increase and a transmit power decrease.

4. The method of claim 1, wherein providing the routine includes providing the routine to run on a mobile telephone.

5. The method of claim 4, wherein providing the routine includes providing the routine to run on a baseband processor of the mobile telephone.

6. The method of claim 1, wherein an output from the DAC is used as a gain control signal to control gain of a variable gain amplifier to set the power output level for transmitting the signal.

7. The method of claim 1, wherein determining the input value and determining the ripple offset value at each of the plurality of frequencies is performed for each gain mode when multiple gain modes are present for transmitting the signal.

8. A method comprising:
identifying an expected transmit power output level at an antenna to transmit a signal from a mobile device, in response to receiving a transmit power control instruction that determines the expected transmit power output level for transmitting the signal;
selecting an input value to a digital-to-analog converter (DAC), which is used to control a gain of a gain control circuit, corresponding to the expected transmit power output level from a plurality of transmit power level input values, wherein the input values compensate for power gains and losses in transmitter stages of the mobile device utilized for transmitting the signal at respective transmit frequencies;
determining a frequency of operation to transmit the signal;
determining a temperature of operation;
selecting a ripple offset value corresponding to the frequency of operation, in which the ripple offset value corrects for a variation in a level of the transmit power between the frequency of operation and a calibration frequency used to set the plurality of input values;
selecting a ripple shift offset value that provides for a correlation between a ripple shift in frequency to changes in temperature;
selecting a power level offset value that provides for a correlation between transmit power variation to changes in temperature;
utilizing the ripple offset value, ripple shift offset value and the power level offset value to modify the selected input value to derive a modified input value; and
applying the modified input value to the DAC to adjust gain of the gain control circuit to compensate for power variations across frequencies and temperature.

9. The method of claim 8, wherein the transmit power control instruction is sent from a base station.

10. The method of claim 8, wherein identifying the expected transmit power control includes filtering a sequence of at least two consecutive transmit power control instructions and to respond to a first of the transmit power control instructions only when the at least two consecutive transmit power control instructions do not toggle to command a transmit power increase and a transmit power decrease.

11. The method of claim 8, wherein utilizing the ripple offset value, the ripple shift offset value and the power level offset value to modify the selected input value includes running a routine in a baseband processor of the mobile device to derive the modified input value.

12. The method of claim 8, wherein an output from the DAC is used as a gain control signal to control gain of a variable gain amplifier.

13. The method of claim 8, further comprising selecting a gain mode prior to selecting the input value and selecting the ripple offset value when multiple gain modes are present for transmitting the signal.

14. An apparatus comprising:
a baseband processor to identify an expected transmit power output level at an antenna to transmit a signal, in response to receiving a transmit power control instruction that determines the expected transmit power output level for transmitting the signal, select an input value to a digital-to-analog converter (DAC) corresponding to the expected power output level from a plurality of input values, wherein the input values compensate for power gains and losses in transmitter stages utilized for transmitting the signal at respective transmit frequencies, the baseband processor to also determine a frequency of operation to transmit the signal and a temperature of operation, the baseband processor to select a ripple offset value corresponding to the frequency of operation, in which the ripple offset value corrects for a variation in a level of the transmit power between the frequency of operation and a calibration frequency used to set the plurality of input values, the baseband processor to select a ripple shift offset value that provides for a correlation between a ripple shift in frequency to changes in temperature, and the baseband processor to also select a power level offset value that provides for a correlation between transmit power variation to changes in temperature, wherein the baseband processor to utilize the ripple offset value, the ripple shift offset value and the power level offset value to modify the selected input value to derive a modified input value;

a gain control circuit, that includes the DAC, coupled to the baseband processor to receive the modified input value for input to the DAC; and a gain stage coupled to receive an output of the DAC to set the transmitter gain that is compensated for power variations across frequencies and temperature.

15. The apparatus of claim 14, further comprising a receiver to receive the transmit power control instruction and the baseband processor to determine the expected transmit power output for transmitting the signal based on the received transmit power control instruction.

16. The apparatus of claim 15, wherein the baseband processor includes a filtering routine to process a sequence of at least two consecutive transmit power control instructions and to respond to a first of the transmit power control instructions only when the at least two consecutive transmit power control instructions do not toggle to command a transmit power increase and a transmit power decrease.

17. The apparatus of claim 14, wherein the gain stage includes a variable gain amplifier, in which the output of the DAC to control a gain of the variable gain amplifier.

18. The apparatus of claim 14, wherein the gain stage is an amplifier for setting the transmitter gain of a mobile phone.

19. The apparatus of claim 14, further including a filter in the transmitter stages.

20. The apparatus of claim 19, wherein the filter is a surface acoustic wave filter.

* * * * *